United States Patent
Hoffman, Jr. et al.

(10) Patent No.: US 6,264,823 B1
(45) Date of Patent: *Jul. 24, 2001

(54) NON-CAUSTIC CLEANING OF CONDUCTIVE AND NON-CONDUCTIVE BODIES

(75) Inventors: John E. Hoffman, Jr., Hummelstown; Richard A. Hoffman, Sr., Harrisburg, both of PA (US)

(73) Assignee: Hoffman Industries International, Ltd., Harrisburg, PA (US)

( * ) Notice: Subject to any disclaimer, the term of this patent is extended or adjusted under 35 U.S.C. 154(b) by 0 days.

This patent is subject to a terminal disclaimer.

(21) Appl. No.: 09/410,333

(22) Filed: Oct. 1, 1999

Related U.S. Application Data

(63) Continuation-in-part of application No. 09/157,176, filed on Sep. 18, 1998, now Pat. No. 6,203,691.
(60) Provisional application No. 60/154,553, filed on Sep. 17, 1999.

(51) Int. Cl.$^7$ .................................................. C25F 1/00
(52) U.S. Cl. ........................ 205/687; 205/688; 205/705; 252/62.2; 204/242
(58) Field of Search .................................. 205/687, 688, 205/705; 252/62.2; 204/242

*Primary Examiner*—Arun S. Phasge
(74) *Attorney, Agent, or Firm*—McNees, Wallace & Nurick; Brian T. Sattizahn; Carmen Santa Maria

(57) ABSTRACT

A method and apparatus for cleaning conductive and non-conductive bodies using a basic aqueous disodium phosphate and sodium bicarbonate cleaning solution. The outside surfaces of a metallic or non-metallic body are cleaned by spraying or brushing the cleaning solution on to body, or by placing the metallic body in electrical contact with the cleaning solution, an anode and a cathode (either of which may be the body itself) and flowing DC current from the anode to the cathode and thus through the chemical solution, thereby causing the cleaning solution to electrolytically clean the body. The DC current is provided by an inverter power source. The body may be immersed in the electrolytic cleaning solution or the electrolytic cleaning solution may be sprayed onto the body.

71 Claims, 5 Drawing Sheets

NON-CAUSTIC CLEANING OF CONDUCTIVE AND NON-CONDUCTIVE BODIES

This application is a continuation-in-part of U.S. application Ser. No. 09/157,176, filed Sep. 18, 1998, now U.S. Pat. No. 6,203,691 and U.S. Provisional Application Ser. No. 60/154,553, filed Sep. 17, 1999.

FIELD OF THE INVENTION

The invention relates to methods, equipment and solutions for the non-caustic cleaning of electrically conductive and non-conductive bodies in an environmentally-friendly manner.

BACKGROUND OF THE INVENTION

Bodies capable of conducting electricity, including bodies made entirely of metal and bodies having both metallic and nonmetallic portions, often have outer surfaces that need to be cleaned. Fabricated or machined metal products require cleaning, for example, prior to painting, coating, packaging or shipment. As another example, metal components which are to be remanufactured for the after-market almost always require some degree of cleaning. Similarly, bodies that are not capable of conducting electricity, that is, bodies that are non-metallic, often have outer surfaces that need to be cleaned.

Rust, scale, smut, petroleum derived contaminants, oils, greases, flux, carbonization, nonmetallic coatings, corrosion, paint, dirt and the like may form or be deposited on the surface of the body. These surface deposits or contaminants must be removed so that the body may be recycled and reused, or to prepare the body for subsequent surface treatment, while at the same time avoiding degradation of any non-metallic pieces, such as rubber and plastic, which may be present on the body to be cleaned. Metal cleaning, including precision cleaning and light/heavy industrial cleaning, is particularly important in industries which are involved in the forming, casting, extruding and machining of ferrous and non-ferrous metals. Examples of metallic bodies that may require cleaning include, for example, grocery carts, metallic brake shoes, jewelry, and electronic circuit boards.

Previously, cleaning of metals was typically accomplished using acidic cleaning solutions (having a pH of 6.0 or less). Prior to the recent increase in awareness of environmental concerns (such as handling safety, toxic exposure, disposal implications, etc.), acidic solutions were most frequently used because of their relative low cost, and their substantial effectiveness (both in total cleaning ability, cleaning speed and cost) in removing metal oxides, scale and other contaminants prior to pretreatment or painting. Typically, such solutions included mineral acids, chromic acid, carboxylic acids and other organic acids. Due to their very aggressive nature, the prior acidic solutions resulted not only in the removal of the undesirable contaminants on the item being treated, but often had the negative effect of potentially degrading the tank walls, pump components and other parts of the washer device itself Further, the solution often had to be replaced due to the change in the pH of the solution over time, and as a result, disposal of the spent solution (which solution today would almost certainly be classified as a hazardous substance, but at that time, most likely was not classified as such) was necessary.

One early method of cleaning metal bodies immerses the bodies in a high temperature cyanide bath. Major ingredients of the cyanide bath include caustic soda and sodium cyanide or potassium cyanide. The bath is heated to a temperature in excess of 700 degrees F. All of the cyanide and alkali materials are limited in life and have to be discarded and entirely fresh bath solutions made. The cyanide bath has the potential of liberating deadly cyanide gas, and the cyanide bath itself is a hazardous waste that requires special and expensive waste treatment and disposal.

More recently, with heightened public awareness and an increase in laws designed to protect the environment (as well as active governmental agencies to enforce such laws against industries, resulting not only in negative publicity to those industries, but also significant costs to accomplish the clean-up of existing waste sites, redesigning facilities, litigation, etc.), the metal cleaning industry began to utilize alkaline chemical solutions (having a pH of 8.0 or greater). These solutions typically use detergents and solvents, accompanied by high levels of agitation (such as by ultrasonic bath or high-pressure wash), to effect removal of contaminants. Alkaline cleaners have been formulated with such materials as sodium or potassium hydroxide, carbonate, bicarbonate, phosphate, silicate or other similar materials. The chemical reaction occurs via saponification with water-soluble soaps by neutralization of fatty acid soils. If the pH of the solution is kept between 8.0 and 13.0, these cleaners are somewhat successful in the removal of oils and greases. However, as with acidic solutions, the spent alkaline solutions must be frequently reprocessed, and further, they present similar hazardous waste disposal problems that previously were of no concern.

For example, to overcome the disadvantages of the cyanide bath, a variety of electrolytic cleaning systems were developed. Many of these systems use caustic soda (NaOH) to form a highly alkaline caustic soda bath. Caustic soda attacks galvanized steel, brass, bronze, copper, aluminum, magnesium, titanium and other metals. The caustic soda attacks the metal itself. Even if the metal could withstand immersion in the caustic soda bath, subsequent brushing or spraying treatments may be needed to remove tenacious impurities. The caustic soda bath is highly corrosive and requires special care in handling and disposal.

Neutral cleaning solutions (having a pH between 6.0 and 8.0) exist, and generally contain surfactants which act as wetting and emulsifying agents. With mechanical agitation or power washing, these solutions are useful for removal of oils, greases and other organic residues. However, care must given in selecting the appropriate solution (which can vary significantly depending on the contaminants being removed) and the types of mechanical agitation or power wash chosen for the process. Further, as with the acidic and alkaline cleaning solutions, reprocessing and/or replenishing of the solution is necessary, and special waste treatment and disposal procedures are necessary.

Other electrolytic cleaning systems have been proposed. One electrolytic system uses an electrolyte solution containing ferric sulfate and ammonium bifluoride. This system may generate objectionable fumes. The system does not de-scale or de-smut. A sludge containing insoluble salts of such metals as aluminum, copper, brass and bronze is generated that must be disposed of as a hazardous waste. Another electrolytic system uses an electrolyte solution composed of a phosphate alkaline material heated to 160–190 degrees F. Metallic ions, such as lead, tin, zinc or cadmium ions act as catalysts in the solution for removal of scale from stainless steel. These metallic ions remain in the spent electrolyte and require hazardous waste treatment and disposal. A film of metal may be deposited on the surface of the treated object. The film may be acceptable in cleaning stainless steel, but would be totally unacceptable in cleaning surfaces of other metallic objects such as circuit boards.

Yet another known method of clearing is directed to consumer cleaning of gold, silver, coins and jewelry. The object to be cleaned is immersed in an electrolyte and a relatively low voltage and amperage electric current is passed through the electrolyte solution. The method is designed specifically to remove tarnish, which are sulfides of gold and silver. During cleaning, hydrogen sulfide gas is created. Hydrogen sulfide is a noxious, poisonous gas that would present a serious problem in commercial operation.

The above conventional methods of cleaning metallic bodies require extremely high operating temperatures, toxic chemicals and/or highly corrosive liquids. These conventional methods are designed primarily to remove rust, scale or smut from iron or steel bodies, and are not suitable for cleaning of other types of metallic or non-metallic bodies. Further, the methods generate hazardous wastes that must be disposed of in compliance with environmental regulations and at high cost. Immersing the metallic body in the electrolyte may also be inefficient, as only a small number of bodies may be treated at a time.

Thus, there is a need for an improved method and apparatus for cleaning conductive and non-conductive bodies. This has become particularly critical in recent years, as a result of numerous restrictive environmental standards which have been mandated by local, state and federal governments. Most, if not all, of the existing processes and solutions used to clean contaminants and other materials from metal objects involve one or more of the following environmental considerations: health and safety concerns for persons handling the solutions and the waste products; formation of odors; foaming properties; environmental reporting requirements; waste treatment and waste disposal, and the costs and other difficulties associated therewith; and recycling costs and other difficulties associated therewith. The improved method should use non-toxic materials that are nonhazardous to personnel and should not require special disposal treatments or procedures.

Beyond the environmental issues which were not necessarily concerns when the existing processes were first developed, there are a number of practical shortcomings which are present in the known methods, including limited effectiveness in removing contaminants, short solution life, and the tedious and time-consuming task of altering key variables (such as range of agitation, range of chemical ingredients of the cleaning solution, time and temperature requirements, etc.) in order to determine the optimum level of each variable that will effectively and efficiently accomplish the desired level of cleaning. These variables may vary dramatically, depending on the composition of the body being treated, and on the particular contaminants for which removal is desired. Therefore, the improved method should clean a wide variety of bodies, and should not be limited to iron or steel. The improved method should be efficient and allow the cleaning of a large number of bodies at the same time. Treatment to clean the bodies should not harm the bodies themselves, but rather, should affect only the contaminants and other materials of which removal is desired.

SUMMARY OF THE INVENTION

The present invention is an improved method and apparatus for cleaning conductive and non-conductive bodies which is non-caustic and environmentally-friendly. Four embodiments are disclosed.

In the first embodiment, a conductive body to be cleaned is immersed in a bath of specialized basic cleaning solution and connected to the cathode of a direct current power source. The anode of the source is immersed in the electrolytic bath. The resulting electrolysis weakens the attachment of deposits and contaminants to the outer surfaces of the body. The cleaned body may be lightly rinsed after removal from the bath to remove any debris remaining on the body.

In the second embodiment, the specialized basic cleaning solution is sprayed from one or more spray nozzles onto the body to be cleaned. The body is connected to the cathode of a direct current power source. The anode of the source is connected to each spray nozzle. The metallic body is washed in a continuous stream of electrolytic cleaning solution. Resulting electrolysis weakens the attachment of foreign matter to the outer surfaces of the article. The electrolyte spray may wash off foreign matter from the metallic body. Electrolyte sprayed on the body is collected, filtered and recycled.

The electrolyte spray allows larger bodies such as transformer cases, shopping carts, extruded and sheet steel, boilers and the like to be cleaned on site. It is not necessary to transport the bodies to a bath. Bodies that are too large to be immersed in a bath or which cannot be moved to a bath can be cleaned using an electrolyte spray.

If desired, a plurality of metallic bodies can be electrolytically spray cleaned at the same time. The bodies are placed in electrical contact with each other and one body is attached to the cathode. Electrolyte spray is sprayed onto all the bodies for simultaneous electrolysis and cleaning of all the bodies. The bodies could move through an electrolyte spray on a conveyor belt to spray clean a continuous stream of bodies.

In a third embodiment, the specialized basic cleaning solution is sprayed from one or more spray nozzles onto the body to be cleaned. A first metal grid or cage is provided, and is connected to the cathode of a direct current power source. The anode of the source is connected in this embodiment not to each spray nozzle, but rather, to a second metal grid or plate. An insulating material is positioned directly between the first metal grid or cage and the second metal grid or plate. The body to be cleaned is placed on, and in direct contact with, the second metal grid or plate, and then is washed in a continuous stream of cleaning solution. As the cleaning solution washes over the body, an electric field is generated, which flows from the first metal grid or cage, through the insulating material, and to second metal grid or plate. The second metal plate is in direct contact with the body being cleaned, which is turn in direct contact with the cleaning solution being sprayed thereon. Resulting electrolysis weakens the attachment of foreign matter to the outer surfaces of the article. The electrolyte spray may wash off foreign matter from the metallic body. Electrolyte sprayed on the body is collected, filtered and recycled.

In a fourth embodiment, the cleaning solution may be utilized without providing current to the solution, to clean certain substances, such as oils and greases. The cleaning solution is simply sprayed, brushed or otherwise suitably applied onto the item to be cleaned. In this embodiment, both conductive and non-conductive items may be cleaned using the cleaning solution of the present invention.

In all embodiments, the cleaning solution is an aqueous solution of disodium phosphate and sodium bicarbonate having a pH greater than 7.0 and less than about 10.0, preferably in the pH range of about 8.0 to about 8.5. In this pH range the solution is not corrosive, is non-hazardous to personnel and is environmentally friendly. The solution can be disposed of by conventional means, and does not have to be treated and disposed of as a hazardous waste.

Temperature ranges for successful cleaning of metallic bodies extend from just above the freezing point of the solution to just below the boiling point of the solution. The preferred operating temperature of the electrolyte is between about 50 degrees F and 150 degrees F.

The solution has a long useful life, whether used in the bath or discharged as a spray, and whether or not an electric current is supplied. The liquid component of the solution needs replenishment only due to the evaporation of liquid from the solution. Other components of the solution are replenished as needed to maintain the proper pH balance of the solution.

Cleaning of objects using the present invention does not contaminate the solution. When used as a bath, metal oxides and other metallic residues removed from the metallic bodies sink to the bottom of the bath. Nonmetallic residues float on the surface of the bath. Both residues can be easily removed from the bath by occasionally collecting each into separate containers. When sprayed, solution can be collected, filtered to remove residues and then reused. The residues are not hazardous and can be disposed of through normal channels.

In each embodiment, a method is provided for cleaning items that is biodegradable, non-toxic, non-flammable, non-corrosive, non-caustic, non-abrasive, non-emulsifying, odorless, which emits no harmful fumes or vapors, and that operates at a moderate, slightly basic, pH level. The method of the present invention is more efficient (in cleaning ability, cleaning time, and cost) than existing methods, such as ultrasonic bath or high-pressure aqueous wash systems. Further, the method of the present invention is substantially more environmentally-friendly than existing methods for cleaning ferrous and non-ferrous metals, as well as non-metallic objects. No disposal or recycling difficulties are present using the method of the present invention.

Other objects and features of the invention will become apparent as the description proceeds, especially when taken in conjunction with the accompanying drawings illustrating the invention, of which there are six sheets.

DESCRIPTION OF THE PREFERRED EMBODIMENTS

Figure 1:
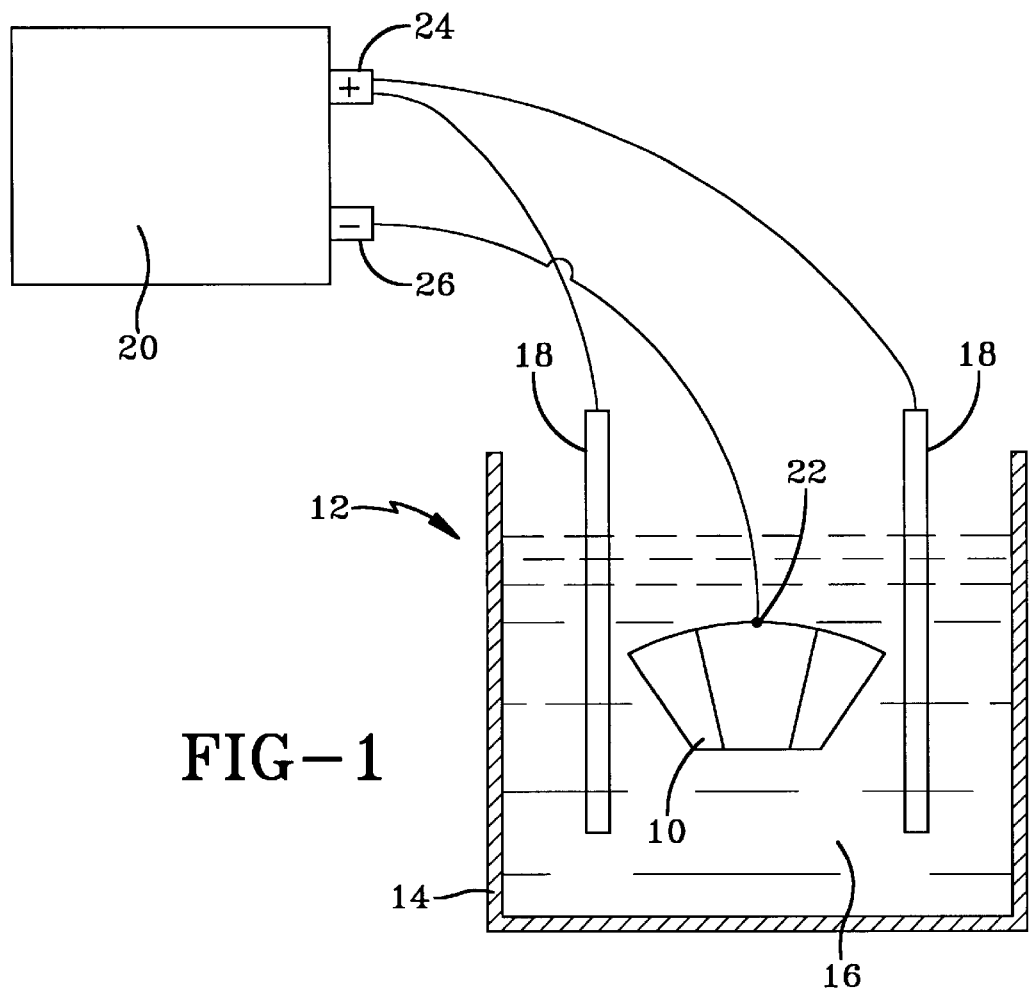
FIG. 1 is a schematic diagram of a brake shoe (without brake pads) immersed in an electrolyte for cleaning.
Figure 4:
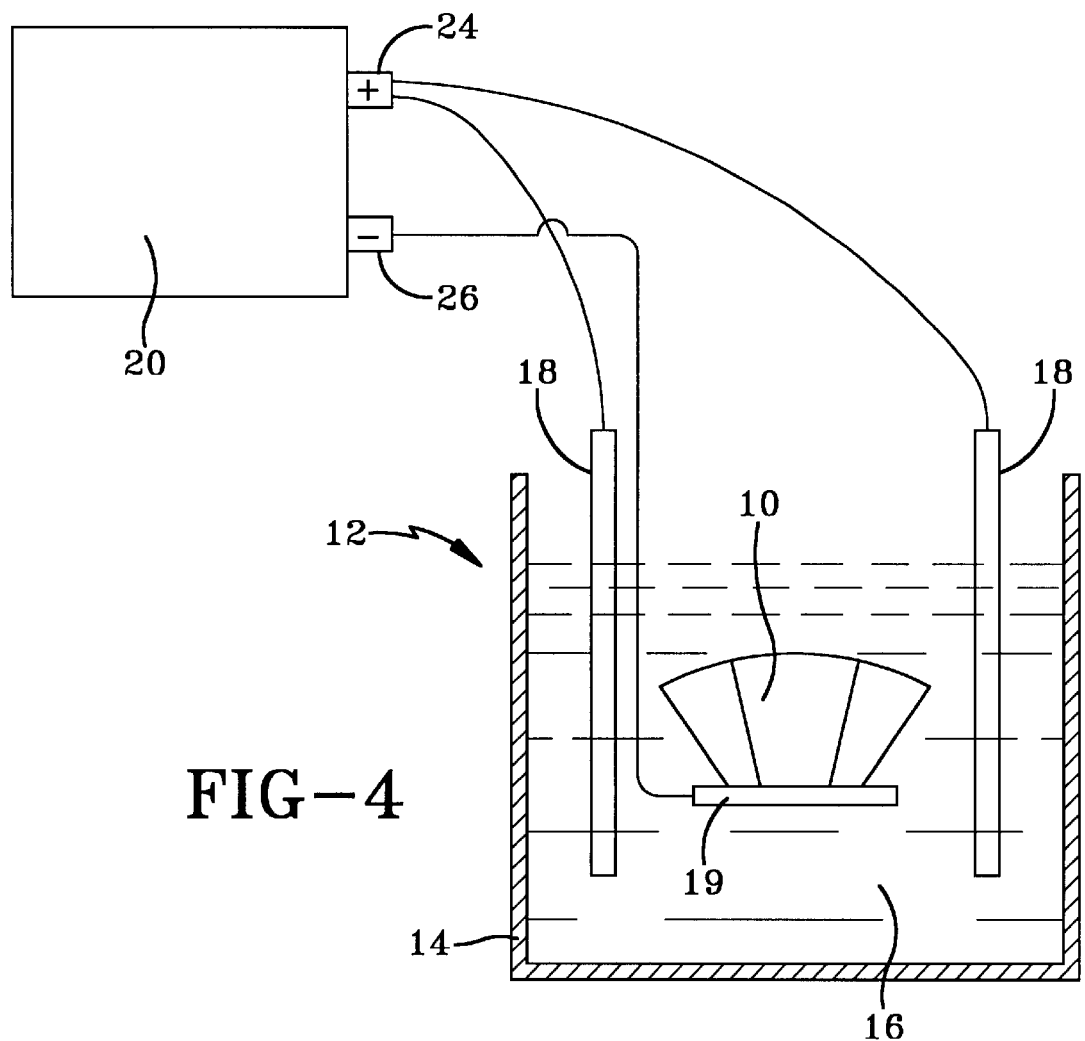
FIG. 4 is a schematic diagram of a brake shoe (without brake pads) immersed in an electrolyte for cleaning.

FIG. 1 illustrates a brake shoe 10 immersed in an electrolyzer 12 for cleaning the outer surfaces of the brake shoe. Brake shoe 10 is steel and typically has surface rust and other contaminants or materials that must be removed to allow painting of the brake shoe. Electrolyzer 12 includes a nonmetallic container or vat 14 holding a basic cleaning solution 16, one or two anodes 18, a power supply direct current source 20, and a cathode contact 22. As shown in FIG. 1, brake shoe 10 is immersed into cleaning solution 16 and is connected to cathode contact 22. Anodes 18 are connected to the positive output terminal 24 of source 20. The cathode contact 22 is connected to the negative output terminal 26 of source 20. Alternatively, as shown in FIG. 4, a metal grid or plate 19 is provided within electrolyzer 12, and grid 19 is connected to the negative output terminal 26 of source 20. In this alternative embodiment, brake shoe 10 is placed on, and in direct contact with, grid 19, and both grid 19 and brake shoe 10 are positioned within electrolyzer 12 so that at least grid 19 is submersed in cleaning solution 16. The grid 19 and anodes 18 must not come into contact with one another, and an insulating material (not shown) may be provided between grid 19 and anodes 18 to avoid such contact. The insulating material is positioned so as to allow for sufficient contact between anodes 18 and cleaning solution 16, as well as between grid 19 and cleaning solution 16.

Figure 5:
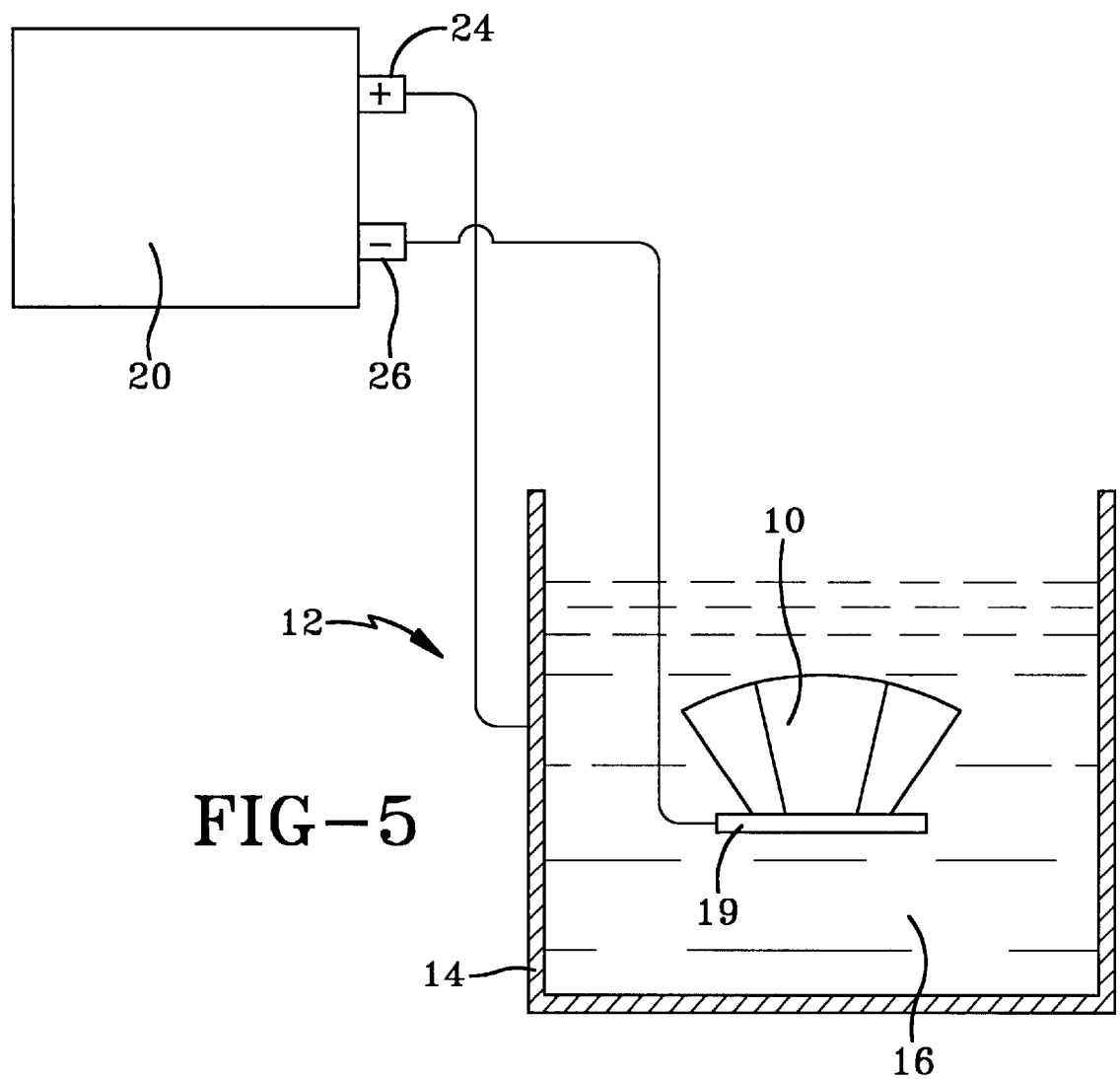
FIG. 5 is a schematic diagram of a brake shoe (without brake pads) immersed in an electrolyte.

Alternatively, container 14 can be made of metal and the positive output terminal 24 of source 20 is connected, such as bolting, directly to container 14, as shown in FIG. 5. In this alternative embodiment, anodes 18 are eliminated. Grid 19 and container 14 must not come into contact with one another, and an insulating material (not shown) may be provided between grid 19 and container 14 to avoid such contact. The insulating material is positioned so as to allow for sufficient contact between container 14 and cleaning solution 16, as well as between grid 19 and cleaning solution 16.

Cleaning solution 16 is an aqueous basic solution made of water, disodium phosphate ($Na_2HPO_4$) and baking soda (sodium bicarbonate, $NaHCO_3$). The disodium phosphate is preferably food grade disodium phosphate, and more preferably is a granular form of food grade disodium phosphate. Disodium phosphate in the powder form may also be used. Ideally, disodium phosphate that is 100% pure, that is, which contains no contaminants, would produce optimum results. However, nearly all commercially available disodium phosphate contains some level of contaminants. In the present invention, it has been found that it is preferable to use disodium phosphate that is approximately 98% pure or greater. Preferably, the disodium phosphate should have no more than about 3 mg/kg of arsenic, about 10 mg/kg heavy metals (such as lead), and no greater about than 0.005% fluoride.

The amount of disodium phosphate which is used in the cleaning solution is about 0.25 pounds per gallon of water to about 1.33 pounds per gallon of water. The amount of baking soda which may is used in the cleaning solution is about 0.125 pounds per gallon of water to about 0.67 pounds per gallon of water. While any combination of disodium phosphate and baking soda within these respective ranges will produce cleaning results without creating any negative environmental implications, it is preferable for the solution to contain approximately twice as much disodium phosphate as baking soda, that is, a ratio of disodium phosphate to baking soda of approximately 2 to 1. Most preferably, approximately 0.5 pounds of disodium phosphate and 0.25 pounds of baking soda are dissolved in each gallon of water to form the cleaning solution. Conventional tap water may be used. Most preferably, distilled water is used.

The exact pH of cleaning solution 16 is not critical as long as the pH is in the basic range and has a pH greater than 7.0 and less than about 10.0. The preferred range of pH of cleaning solution 16 is between 8.0 and 8.5 inclusive. In this pH range, the cleaning solution is not corrosive and is environmentally friendly. In the embodiments wherein a power source is provided, the temperature of cleaning solution 16 may range from just above the freezing point of the cleaning solution to just below the boiling point of the cleaning solution. The preferred temperature of cleaning solution 16 is between 55 degrees F. and 160 degrees F. An external source of cooling or heating is not provided; rather, the temperature is dependent upon the electric current which is being generated within the cleaning solution 16.

Any suitable power supply can be used to provide the electric current necessary to accomplish electrolytic cleaning. For example, power supply 20 may be one that produces a low voltage direct current output from 5 to 350 DC amps output from a 60 hz, 230v, 3 phase alternating current source. With respect to the first embodiment, in order to avoid degradation of the metal substrate, that is, of the actual body being cleaned, the range of amps which may be supplied is preferably about 1 amp per gallon of cleaning solution to about 20 amps per gallon of cleaning solution. More preferably, the range of amps supplied is about 2 amps to about 10 amps per gallon of cleaning solution, and most preferably, about 5 amps per gallon of cleaning solution. The ideal balance between the anode and the cathode occurs when the voltage in the cleaning solution reaches its maximum level. If the correct balance is not achieved between the anode and the cathode, a low voltage will result. As the voltage level declines, the cleaning ability of cleaning solution 16 decreases as well. The higher the voltage, the higher the cleaning ability.

It has been found that power sources which have traditionally only been used in connection with welding machines, when used with the methods, equipment and solutions of the present invention, provide surprising results in terms of increased efficiency, effectiveness and cleaning power over known methods for cleaning conductive bodies. For example, power supply 20 can be an Invertec V300-Pro power source manufactured by The Lincoln Electric Company of Cleveland, Ohio. Other power supplies and anodes may be used.

A conventional rectifier power source converts alternating current to direct current using diodes or thyristers (SCR). The transformer in a conventional rectifier power source is a step-down transformer that reduces the primary voltage to a useable level. Subsequently, the SCR/diode bridge converts the alternating current to direct current. A stabilizer maintains current in the circuit.

The transformer of a conventional welding power supply takes the power supplied from the utility company and steps the voltage down between 60–80 volts alternating current, depending of the type of welding machine. The transformer also serves as isolation from input to output. Once the primary voltage is stepped down, it is converted to direct current by the rectifier.

The rectifier is located on the secondary side of the isolation transformer and is a full wave bridge that has 6 SCR's. The instant at which the thyristor begins to conduct depends on the line frequency, alternating current voltage, waveforms and the control inputs. The magnitude of the average output can be controlled by delaying the instant at which the thyristors are allowed to start conduction. The stabilizer in the circuit is used to provide continuous current to the output.

By contrast, in an inverter power source such as the Invertec V300-Pro, the input alternating current voltage is rectified into an unregulated direct current voltage by means of a diode rectifier. Subsequently, the power converter must take the unregulated direct current and convert it to regulated direct current with a lower voltage level. This is accomplished by a high-frequency bridge, wherein switching causes the generation of a high frequency square wave alternating current. The high frequency alternating current is transferred to the secondary side by means of an isolation transformer, which is then rectified and filtered to produce the regulated direct current output. By controlling the switching of the high frequency bridge, the output is thereby regulated.

Electrolytic cleaning using a conventional rectifier power source requires alternating or reversing the polarity of the cathode and anode, not only maintain a stable electric field, but also to prevent corrosive deterioration of the cathode and anode, as well as to prevent smut from being attracted to the cathode and anode. While conventional rectifier power sources may be used, in the preferred embodiment an inverter power source is used. It has been found that by using an inverter power source with the cleaning solution, apparatuses and methods of the present invention, as well as with known electrolytic cleaning solutions, apparatuses or methods (whether environmentally friendly or not), the electrolytic cleaning process decreases the time in which debonding and removal of surface materials, contaminants, etc. are removed from metal bodies. Further, there is no need to reverse the polarity of the cathode and anode. As such, the process of the preferred embodiment does not deteriorate or degrade the cathode or anode. Further, an inverter power source allows the cleaning process to be performed at a much lower solution temperature than a conventional rectifier power source. The inverter power source is particularly preferred when electrolytic cleaning via a spray system is desired. In all electrolytic cleaning systems, the higher frequency, more defined direct current produced by an inverter system allows the de-bonding of rust and paint from metal to a significantly larger degree than that which is achieved using a conventional rectifier power source.

As shown in FIG. 1, brake shoe 10 is totally immersed into cleaning solution 16 and is connected as the cathode of power supply 20. Power supply 20 is energized to flow current across electrolyzer 12 for cleaning the outer surfaces of brake shoe 10. During normal cleaning, power supply 20 is energized for from 2 to 3 minutes per brake shoe, or for a longer time as necessary, depending on the severity of surface contaminants that need to be removed from the brake shoe. During cleaning bubbles of $CO_2$ gas are evolved. The bubbles agitate the cleaning solution 16 adjacent the part 10. The agitation may help in mechanically removing surface contaminants and may aid in cleaning the brake shoe 10. No toxic or environmentally hazardous gases are evolved. Most surface contaminants removed from the brake shoe sink to the bottom of container or vat 14 and form a sludge. Other surface contaminants may float on the top of cleaning solution 16. The sludge and floating residue are physically removed by occasionally collecting each into separate containers. The sludge and floating residue are non-hazardous and may be disposed of through normal channels. Brake shoe 10 can be left in the cleaning solution 16 for extended periods of time without damage to the brake shoe 10 itself.

After treatment of a brake shoe 10 in electrolyzer 12, power supply 20 is deactivated. The brake shoe is removed from cleaning solution 16 and disconnected from cathode contact 22. The brake shoe is lightly rinsed with water to remove any loose debris still adhering to the brake shoe.

After rinsing, the outer surfaces of brake shoe 10 have been cleaned and are ready for any post-cleaning surface treatment. For example, the brake shoe may be dried and subsequently painted.

Cleaning solution 16 is long lasting in treating metal bodies without draining or adding of additional constituent materials, although water may be added as required to replace water lost through evaporation. Sludge and floating residues are periodically removed from the electrolyte. The pH of cleaning solution 16 is checked regularly and additional disodium phosphate and baking soda are added in proper proportion to cleaning solution 16 to maintain the pH of the electrolyte in its preferred range of between 7.0 and about 10.0 inclusive, and more preferably between about 8.0 and about 8.5 inclusive.

When anodes 18 are made from stainless steel, they generally are not sacrificed during electrolysis and are used continuously. Other types of anodes may act as sacrificial anodes and should be inspected and replaced as necessary.

FIG. 4 illustrates an alternative or modified form of the embodiment shown in FIG. 1. In this alternative embodiment, a metal grid or plate 19 is provided within electrolyzer 12, and grid 19 is connected to the negative output terminal 26 of source 20. Brake shoe 10 is placed on, and in direct contact with, grid 19 and both grid 19 and brake shoe 10 are positioned within electrolyzer 12 so as that grid 19 is submersed in cleaning solution 16. The grid 19 and anodes 18 must not come into contact with one another, and an insulating material (not shown) may be provided between grid 19 and anodes 18 to avoid such contact. However, the insulating material is positioned so as to allow for sufficient contact between anodes 18 and cleaning solution 16, as well as between grid 19 and cleaning solution 16. As with the embodiment shown in FIG. 1, power supply 20 is energized to flow current across electrolyzer 12 for cleaning the outer surfaces of brake shoe 10. The electric field generated flows from anodes 18 (which are connected to the positive output terminal 24 of power source 20), through cleaning solution 16 to grid 19 (which is connected to the negative output terminal 24 of power source 20). Brake shoe 10 is in turn in direct contact with grid 19, and the resulting electrolytic process accomplishes cleaning of brake shoe 10 in the same manner as described in connection with the embodiment shown in FIG. 1.

FIG. 5 illustrates an alternative or modified form of the embodiment shown in FIGS. 1 and 4. In this alternative embodiment, container 14 is made of metal and the positive output terminal 24 of source 20 is connected, such as bolting, directly to container 14, thereby eliminating the need for anodes 18. Grid 19 and container 14 must not come into contact with one another, and an insulating material (not shown) may be provided between grid 19 and container 14 to avoid such contact. However, the insulating material is positioned so as to allow for sufficient contact between container 14 and cleaning solution 16, as well as between grid 19 and cleaning solution 16. The electric field generated flows from container 14 (which is connected to the positive output terminal 24 of power source 20), through cleaning solution 16 to grid 19 (which is connected to the negative output terminal 24 of power source 20). Brake shoe 10 is in turn in direct contact with grid 19, and the resulting electrolytic process accomplishes cleaning of brake shoe 10 in the same manner as described in connection with the embodiments shown in FIGS. 1 and 4.

FIG. 1 illustrates a single brake shoe 10 immersed in electrolyzer 12 for cleaning. However, a number of brake shoes in contact with each other can be immersed in electrolyzer 12 for simultaneous cleaning of the brake shoes. One of the brake shoes is connected to cathode contact 22. The other brake shoes touch the brake shoe connected to cathode contact 22 or form a series of brake shoes that contact one another and include the brake shoe connected to cathode contact 22. Alternatively, vat 14 could be made from stainless steel and connected to the negative terminal 26 of power supply 20 to form the cathode of electrolyzer 12. The brake shoes would contact vat 14 to be connected to the cathode.

Figure 2:
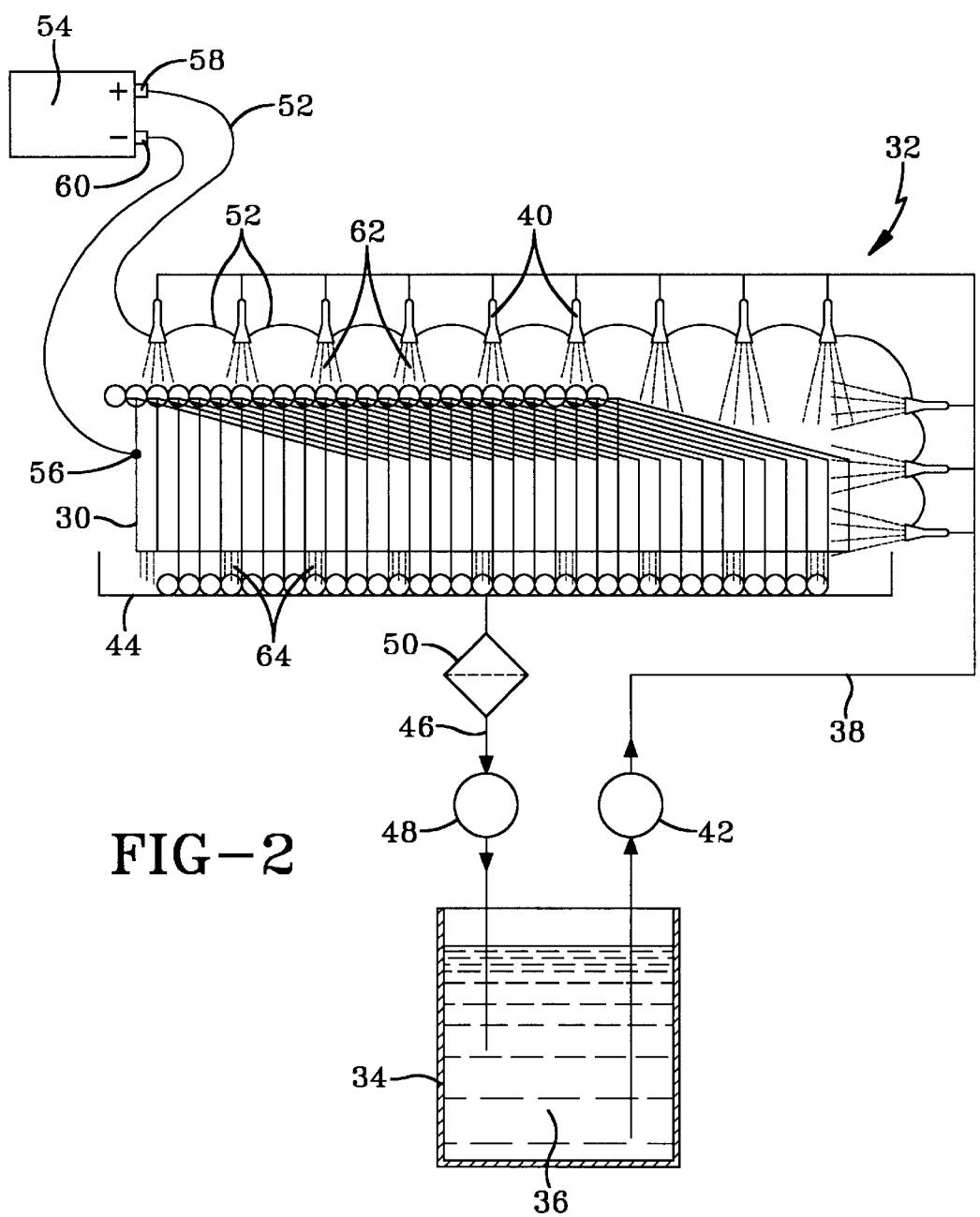
FIG. 2 is a schematic diagram of a plurality of grocery carts being sprayed with electrolyte for cleaning the outer surfaces of the grocery carts.

FIG. 2 illustrates a plurality of grocery carts 30 located in a spray washer 32 for cleaning the outer surfaces of grocery carts 30. Each grocery cart 30 includes a basket formed from steel rods. The basket is mounted on a wheeled base. The cart is electrolytically plated. Typically, carts are plated by forming a layer of nickel-chrome alloy overlying the ferrous body or a layer of zinc overlying the ferrous body.

In use, grocery carts are often left exposed to the outdoor environment where water collects on the body of the grocery cart. The underlying ferrous body is exposed to this water at breaks in the plating. A galvanic process oxidizes the exposed iron. Water with oxidized iron flows over the exterior plated surfaces of the body and forms a thin layer of deposited rust on top of the plating. The deposited rust is believed to adhere to the plating layer by chemical bonds. This layer is unsightly and dulls the appearance of the cart. To restore the appearance of the cart, the deposited rust on the outer surfaces of the grocery cart must be removed.

Spray washer 32 includes a reservoir 34 containing a supply of cleaning solution 36. A supply line 38 extends from reservoir 34 to a plurality of spray nozzles 40. Feed pump 42 in supply line 38 pumps cleaning solution from the reservoir to the spray nozzles. A drain basin 44 collects sprayed electrolytic cleaning solution which flows into return line 46. The returned electrolyte passes through filter 50 and flows to drain pump 48 in line 46 for return to reservoir 34. Nozzles 40 form a plurality of anodes and are connected to the positive terminal of direct power supply 54.

As shown in FIG. 2, grocery carts 30 are nested or pushed together in contact with one another. The nested grocery carts are surrounded by spray nozzles 40. The spray nozzles 40 are oriented to discharge cleaning solution towards the grocery carts and are each located about 2 inches away from the grocery carts.

One of the nested grocery carts is connected to cathode contact 56. The remaining grocery carts are connected in series to cathode contact 56 by the mutual contact between each of the nested grocery carts. Cathode contact 56 is connected to the negative output terminal 60 of power supply 54.

Cleaning solution 36 is identical to electrolyte 16 and power supply 54 is identical to power supply 20.

Supply pump 42 is energized to provide a flow of cleaning solution 36 to each spray nozzle 40. As shown in FIG. 2, each nozzle 40 directs a stream or streams 62 of cleaning solution against the grocery carts. Power supply 54 is energized to provide an electric current for electrolytic cleaning of the outer surfaces of grocery carts 30. During normal cleaning, power supply 54 is energized for about 45 minutes to clean 40 nested grocery carts. During cleaning, cleaning solution 36 is sprayed onto the grocery carts 30. Each stream of sprayed electrolytic cleaning solution strikes the grocery carts 30 and flows to adjacent areas of the grocery carts that are not directly in the spray path of the nozzles or impinged by an electrolyte stream. Some of these areas 64 are represented in FIG. 2. Nozzles 40 are arranged so that the entire surface area of the grocery carts is wetted by sprayed, splashed or dripped cleaning solution to assure electrolytic treatment of the entire surface area.

Figure 3:
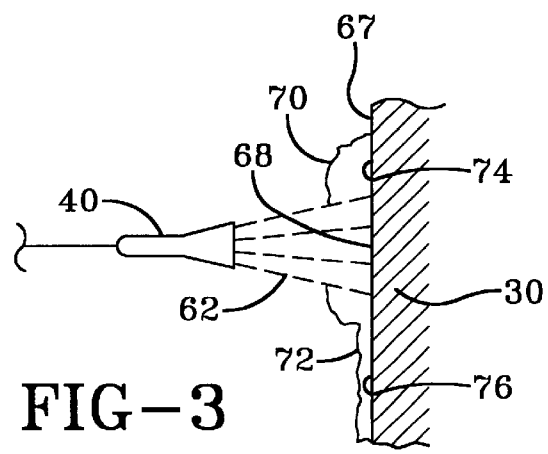
FIG. 3 is a schematic diagram of a surface of a grocery cart being cleaned by the sprayed electrolyte.

FIG. 3 illustrates in greater detail the electrolytic treatment of the surface of a cart. Nozzle 40 flows a continuous stream 62 of cleaning solution onto a surface 67 of a grocery cart 30. The stream directly impacts or impinges on a small area 68 of surface 67. Impingement area 68 forms part of the cathode and is electrically connected to the anode by stream 62. Electrolytic cleaning takes place on surface area 68.

Some electrolyte bounces off surface 67 and forms a mist or fog 70 surrounding the impact area 68. The electrolyte mist 70 is sufficiently dense to be electrically conductive and forms a portion of the electrical circuit between the anode and cathode. Other electrolyte from the streams from impact area 68 flows along surface 76 and wets a surface area considerably larger than the area of impingement 68. The surface electrolyte 72 flowing from area 68 remains in fluid connection with electrolyte stream 62 and remains a part of the electrical circuit between the anode and the cathode so that a greatly enlarged surface area is cleaned. Electrolytic activity occurs on surface area 74 of surface 67 in contact with electrolyte mist 70 and the wetted portion of surface 76 in contact with the stream. These areas can greatly increase the area of electrolytic cleaning around area 68.

The surface area cleaned by a stream 62 is not limited to the surface area directly impinged by the stream. The nozzles 40 are preferably arranged to maximize the surface areas 74, 76 wetted by electrolyte and electrically connected with the anode, and to overlap these areas so that the entire surfaces of the carts are electrolytically cleaned. Wetting of the surfaces of the carts is aided by gravity flow of electrolyte down the carts and by surface tension wetting of recesses and valleys on the surfaces of the carts.

Drain basin 44 collects the sprayed cleaning solution and directs it into drain line 46. Filter 50 filters contaminants from the drained cleaning solution prior to being returned to reservoir 34. Drain pump 48 pumps the filtered cleaning solution back to reservoir 34 for reuse. The cleaning solution can be continuously pumped out of the reservoir, sprayed onto the grocery carts and returned to the reservoir.

After cleaning of grocery carts 30 in spray washer 32, power supply 54 is deactivated. The grocery carts are disconnected from cathode contact 56 and are removed from spray washer 32. The grocery carts are rinsed with water to remove any loose debris still adhering to the carts. After rinsing, the outer surfaces of the grocery carts 30 are clean and are ready for post-cleaning surface treatment. For example, the grocery carts may be dried and a polyurethane coating subsequently applied.

Cleaning solution 36 is long lasting in treating metal bodies without draining reservoir 36 or adding of additional constituent materials, although water may be added as required to replace water lost through evaporation. Residues and contaminants washed off the metal bodies are removed by filter 50. The pH of cleaning solution 36 is checked regularly and additional disodium phosphate and/or baking soda are added in proper proportion to cleaning solution 36 as necessary to maintain the specific gravity of the electrolyte in its preferred range of between 7.0 and about 10.0, inclusive, and more preferably between about 8.0 and 8.5, inclusive.

Stainless steel anodes 52 generally are not sacrificed during electrolysis and are used continuously. Other types of anodes may act as sacrificial anodes and should be inspected and replaced as necessary.

The streams of electrolyte spray electrically connect the anodes to the metallic body or bodies being cleaned by spray washer 32. It is important that the electrolyte discharged from the nozzles 40 be in continuous streams extending from the anode to the metallic body. The electrolyte supplied to the nozzles is supplied at a pressure of between about 25 pounds per square inch and 1500 pounds per square inch, and preferably between about 600 pounds per square inch and about 800 pounds per square inch to prevent separation of the streams into droplets. The length of the streams from the nozzles to the body being cleaned should be two inches or less in order to maintain the electrical continuity of the stream. It is believed that streams longer than two inches separate into separate droplets and cannot support electrolysis.

The number, location and orientation of spray nozzles 40 can be varied to conform to the shape of the object or objects being cleaned to assure wetting by the cleaning solution and to maintain electrical stream continuity. The objects being cleaned could be placed on a conveyor to move through the electrolyte spray. The objects would be exposed to the spray for a sufficient time to be cleaned. Alternatively, the nozzles could move and the objects being cleaned could remain stationary. The spray washer could be mounted on a truck to allow spray washing of large or immobile objects such as over-the-road trailers and aircraft. One or more spray nozzles could be attached to a flexible supply line to permit an operator to direct the electrolyte spray where needed.

Figure 6:
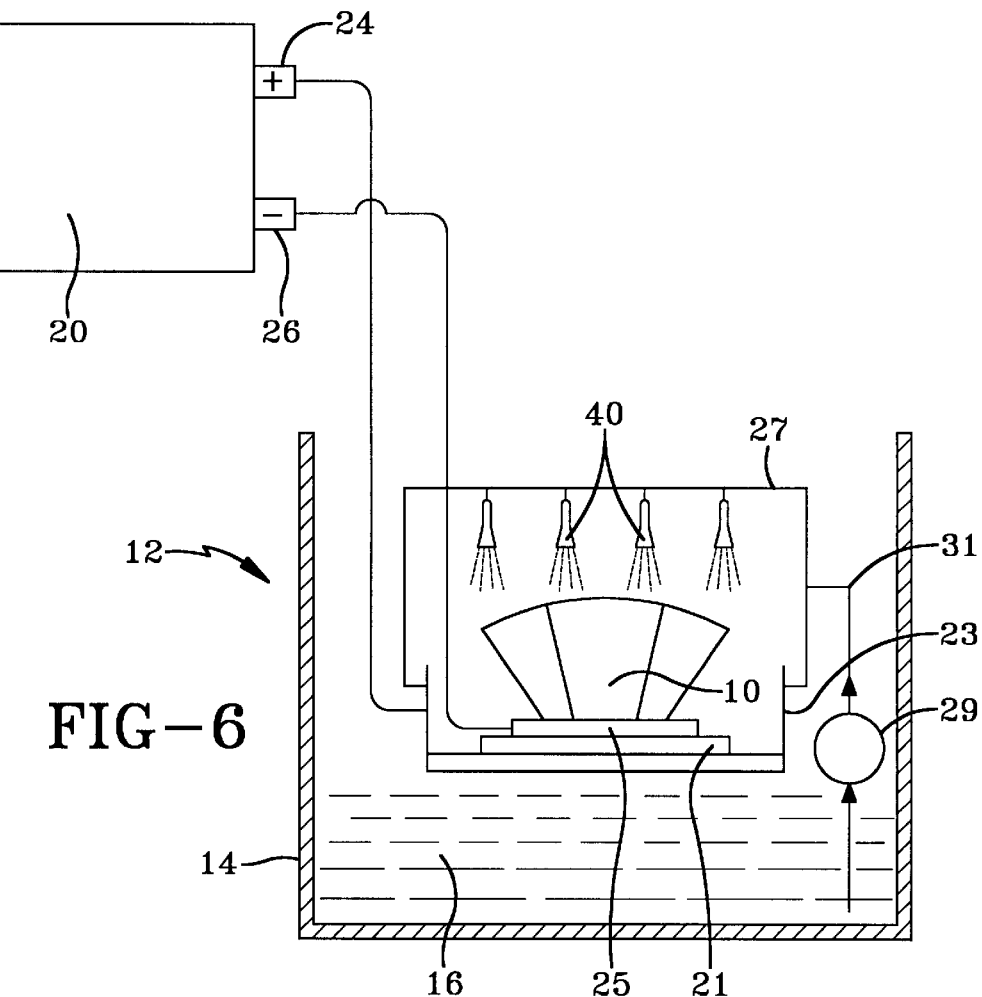
FIG. 6 is a schematic diagram of a brake shoe (without brake pads) being cleaned by the sprayed electrolyte.

In the third embodiment, as shown in FIG. 6, the spray wash techniques discussed in connection with the embodiment shown in FIGS. 2 and 3, are combined with the electrolyzer structure discussed in connection with the embodiments shown in FIGS. 1, 4 and 5. A first metal grid or cage 23 is provided, and is connected to the cathode 24 of a direct current power source. The anode 26 of the source is connected not to each spray nozzle as in FIG. 2, but rather, to a second metal grid or plate 25. An insulating material 21 is positioned directly between first metal grid 23 and second metal grid 25. Insulating material 21 is porous enough to allow for the passage of cleaning solution through it, and yet still provide the necessary separation between the anode and cathode (i.e., first grid 23 and second grid 25). The body to be cleaned, in this case brake shoe 10, is placed on, and in direct contact with, second metal grid 25. Container 14 holds an amount of cleaning solution 16 which is sufficient to accomplish cleaning of the metal body, but the level of cleaning solution remains below that of the second metal grid 25 so as not to come in contact with first metal grid 23, second metal grid 25, insulating material 21, or brake shoe 10.

Spray washing device 27 includes a plurality of spray nozzles 40, and is arranged in relation to the first and second metal grids so as to aim the direction of spray nozzles 40 towards the brake shoe 10. Spray nozzles 40 may be positioned above brake shoe 10, as shown in FIG. 6, or may be positioned below brake shoe 10 (not shown), or both. Additional spray nozzles may be placed around the body to be cleaned in any desired fashion, such as by including spray nozzles which are positioned along the sides of brake shoe 10, that is, in a perpendicular direction to any spray nozzles which are above and/or below brake shoe 10. Further, spray washing device 27 may be adapted so as to allow it to rotate around brake shoe 10 during cleaning, thereby assuring that cleaning solution will be directed at the entire surface area of brake shoe 10.

A supply line 31 extends from cleaning solution 16 to spray washing device 27. Power supply 20 is energized to provide an electric current for electrolytically cleaning the outer surface of brake shoe 10. Feed pump 29 in supply line 31 pumps cleaning solution to spray nozzles 24, whereupon cleaning solution 16 is sprayed from one or more spray nozzles onto the body to be cleaned and then is washed in a continuous stream of cleaning solution. As the cleaning solution washes over the body, an electric field is generated, which flows from the first metal grid 23 (which is connected to negative output terminal 26 of power source 20), through the insulating material, and to second metal grid 25 (which is connected to positive output terminal 24 of power source 20). Second metal grid 25 is in direct contact with the brake shoe 10, which is turn in direct contact with the cleaning solution being sprayed thereon. The resulting electrolysis occurs in much the same manner as described in connection with the embodiment shown in FIGS. 2 and 3, weakening the attachment of foreign matter to the outer surfaces of the article. The electrolyte spray may wash off foreign matter from the metallic body. Electrolyte sprayed on the body passes through second grid 25, insulating material 21 and first grid 23, into the bottom of container 14, where the initial supply of cleaning solution 16 was contained. Cleaning solution 16 is then filtered (not shown) and recycled by being continuously drawn through supply line 31 by feed pump 29.

In the fourth embodiment, the cleaning solution is utilized as a spray wash for the removal of certain materials from the surface of both metals and non-metals without the need for a power source. The cleaning solution is simply sprayed, brushed, or otherwise applied to the body to be cleaned in a manner which will accomplish removal of the desired substances. For example, in the embodiments shown in FIGS. 2, 3 and 6, power source 20 is eliminated, as well as the connections leading from the positive and negative output terminals (thereby eliminating the need, in FIG. 6, for first metal grid 23, insulating material 21 and second metal grid 25). Cleaning solution is provided to the spray nozzles and the composition of the cleaning solution, in combination with the mechanical agitation provided by the spraying action, results in removal of certain substances such as oils and greases. Any suitable spray device, such as a hand-held trigger type device attached to a supply of cleaning solution, may be utilized. Further, other means of mechanical agitation, such as brushing or rubbing, may be used instead of, or in addition to, spraying. As with the embodiments which do utilize a power source, the cleaning solution in this embodiment does not penetrate the object being cleaned, and therefore, does not cause emulsification of the oils and greases and does not result in the production of a hazardous waste material that must be subjected to special disposal or recycling treatments.

In all of the embodiments, the cleaning solution and the process steps used result in a method for removing materials and contaminants from metals and non-metals in a matter which is economical and efficient The present invention removes a wide variety of materials, including rust, scale, smut, petroleum derived contaminants, oils, greases, flux, carbonization, nonmetallic coatings, corrosion, paint, dirt, and oxides, without any degradation or discoloration of the surface of the body being cleaned. All ferrous and non-ferrous metals may be treated using the present invention to successfully clean and remove contaminants and other materials therefrom. The cleaning solution is long-lasting, and requires replacement or replenishment on a very infrequent basis. Further, by utilizing an inverter power source, the process of the present invention accomplishes a level of cleaning which is equal to or better than known electrolytic cleaning techniques (including those techniques which today are considered to be not environmentally friendly, caustic, inefficient, non-economical, etc.), and does so in a manner which is equal to or faster than known methods.

The cleaning solution and the process steps used in the above embodiments also provide a method for cleaning metals that is environmentally safe in a manner far beyond that of known metal cleaning solutions and techniques. The present invention reduces or eliminates health and safety concerns for persons handling the solutions and the waste products, the formation of odors, foaming properties, environmental reporting requirements, special waste treatment and waste disposal procedures (and the costs and other difficulties associated therewith), and recycling costs and other difficulties associated therewith. The cleaning solution and process steps of the above embodiments provide a method for cleaning metals which is biodegradable, non-toxic, non-flammable, non-corrosive, non-caustic, non-abrasive, non-emulsifying, odorless, which emits no harmful fumes or vapors, and which operates at a moderate, slightly basic, pH level.

The following examples of cleaning metallic bodies further illustrate the invention.

EXAMPLE 1

An electrolyte solution was prepared by dissolving disodium phosphate at a concentration of about 1.25 pounds per gallon of water and sodium bicarbonate at a rate of about 0.34 pounds per gallon of water. The volume of electrolyte was sufficient to form a bath sufficient to totally submerge approximately 1800 pounds of shredded or whole used aluminum cans. The outer surfaces of the cans were coated with laquer paint and printing inks. Two stainless steel electrodes were placed in the solution and connected to the positive terminal of a direct power supply. The connected to the negative terminal of the power Supply was submerged aluminum cans. The power supply was energized and 80 to 95 amps were flowed through the electrolyte. In approximately minutes, all the laquer paint and printing inks were removed from the cans and bare metal was exposed The power supply de-energized and the aluminum cans removed from the bath. The cans were rinsed to remove debris and recycled.

EXAMPLE 2

An electrolyte bath was prepared as in Example 1. The volume of the bath was sufficient to totally submerge 100 used commercial brake shoes, with brake lining removed. The electrodes and power supply terminals were connected as in Example 1 and the power supply was activated as in Example 1. After 20–30 minutes the power supply was deactivated and the brake shoes removed from the bath. Each brake shoe was lightly rinsed to remove debris. The brake shoes were sufficiently clean to paint for reuse.

EXAMPLE 3

An electrolyte bath was prepared as in Example 1. The volume of the bath was sufficient to totally submerge 40 used chrome plated grocery carts. The electrodes and power supply terminals were connected and activated as in Example 1. After 30–40 minutes the power supply was deactivated and the grocery carts were removed from the bath. The grocery carts were washed to remove loose debris and a coating was applied to protect the cleaned carts from weathering. The finished surfaces of the carts were restored to almost new condition.

EXAMPLE 4

An electrolyte was prepared as in Example 1. The volume of electrolyte was sufficient to fill a 400 gallon holding tank attached to a pump supplying a spray system mounted in another tank in which 40 used chrome plated grocery carts were placed. The grocery carts were nested with the carts electrically contacting a direct current power one another. The negative terminal of supply was connected to the grocery cars. The positive terminal of the power supply was connected to a series of nozzles positioned to flow streams of electrolyte on the carts. The power supply was activated along with the spray system. The stream pattern of the nozzles wetted all of the grocery cart surfaces. Excess electrolyte was drained from the cart tank, filtered and pumped to the pump holding tank for reuse. After 45 minutes, the power supply and spray system were deactivated and the grocery carts were removed. Each cart was power washed to remove loose debris and coated to protect against weathering. The surfaces of the carts were restored to almost new condition. The carts contained plastic components which were not effected by cleaning.

EXAMPLE 5

Same as Example 3, except zinc plated grocery carts were cleaned. After cleaning, the carts were restored to almost new condition.

EXAMPLE 6

Same as Example 4, except zinc plated grocery carts were cleaned. After cleaning, the carts were restored to almost new condition.

EXAMPLE 7

An electrolyte bath was prepared as in Example 1. The volume of the bath was sufficient to totally submerge a used motor vehicle engine head. The electrodes and power supply were connected and activated as in Example 1. After 10–30 minutes the power supply was deactivated and the head was removed from the bath and rinsed to remove loose debris. The head was in almost new condition free from rust and other foreign matter.

EXAMPLE 8

An electrolyte bath was prepared as in Example 7. The volume of the bath was sufficient to totally submerge rusted and carbonized steel bars. The bars contacted each other. The electrodes and power supply were connected and activated as in Example 9. After 20 minutes the power supply was deactivated and the steel bars were removed from the bath. The steel bars were rinsed to remove loose debris and appeared to be in almost new condition.

EXAMPLE 9

Example 7 was repeated but, instead of submerging the engine head in electrolyte, the engine head was sprayed using the technique used in Example 4. The cleaned engine head appeared in almost new condition.

EXAMPLE 10

Example 8 was repeated but, instead of submerging the steel bars in electrolyte, the steel bars were sprayed using the technique used in Example 4. The cleaned steel bars appeared in almost new condition.

EXAMPLE 11

An electrolyte bath was prepared as in Example 1. The volume of the bath was sufficient to totally submerge an oxidized, greasy and glazed copper bus bar. The electrodes and power supply were connected and activated as in Example 1. After 10 minutes the power supply was deactivated and the bus bar was removed from the bath. After cleaning the bus bar was restored to almost new condition without any visible chemical degradation of the surface.

EXAMPLE 12

Example 13 was repeated but, instead of submerging the copper bus bar in electrolyte, the bus bar was sprayed for 10–15 minutes using the same technique as in Example 4. The cleaned bus bar was restored to almost new condition without any visible chemical degradation of the surface.

EXAMPLE 13

An electrolyte bath was prepared as in Example 1. The volume of the bath was sufficient to totally submerge an oxidized, glazed painted transformer casing. It was desired to remove the oxidation from the steel casing but to leave painted areas unharmed. The electrodes and the power supply were connected and activated as in Example 1. After 10–15 minutes the power supply was deactivated and the transformer casing was removed from the bath. After cleaning the transformer casing was restored to almost new condition without any damage to the unit. The paint was unharmed. If it were desired to remove the paint from the casing, the power supply would have been activated for a longer time to remove the paint.

EXAMPLE 14

Example 13 was repeated but, instead of submerging the painted transformer casing in electrolyte, the transformer casing was sprayed for 10–15 minutes using the same technique as in Example 4. The cleaned transformer was restored to almost new condition without any damage to the unit or to the paint. If removal of paint were desired, the transformer casing would have been sprayed a longer time to remove the paint.

EXAMPLE 1

An electrolyte bath was prepared as in Example 1. The volume of the bath was sufficient to totally submerge 50 brass fittings. The electrodes and power supply were connected and activated as in Example 1. After 5 minutes the power supply was deactivated and the brass fittings were removed from the bath. The brass fittings were rinsed to remove debris. The brass fittings were restored to almost new condition with no evidence of degradation.

EXAMPLE 16

An electrolyte bath was prepared as in Example 1. The volume of the bath was sufficient to totally submerge a variety of stainless steel parts, sheets and bars. The electrodes and power supply were connected and activated as in Example 1. After 10–15 minutes the power supply was deactivated and the stainless steel parts were removed from the bath. The stainless steel parts were restored to almost new condition with no chemical degradation evident.

EXAMPLE 17

Example 16 was repeated but, instead of submerging the stainless steel parts in electrolyte, the stainless steel parts were sprayed using the same technique as in Example 4. The stainless steel parts were restored to almost new condition with no chemical degradation evident.

EXAMPLE 18

An electrolyte bath was prepared as in Example 1. The volume of the bath was sufficient to totally submerge 50 computer circuit boards. The negative terminal of the power supply was connected to E the metallic portions of the circuit boards. The positive terminal of the power supply was connected as in Example 1. The power supply was energized as in Example 1. After 5 minutes the power supply was deactivated and the circuit boards were removed from the bath. The circuit boards were rinsed and air dried. Inspection of the circuit boards showed complete removal of all foreign matter, including excessive flux, grease and oil. Not only were the metal surfaces cleaned, but the nonmetallic portions of the boards were also cleaned. It is theorized that the $CO_2$ bubbles generated during electrolysis of the metal portions of the circuit boards mechanically cleaned the adjacent nonmetal portions of the circuit boards, but the exact mechanism which cleaned the nonmetallic portions is not known.

EXAMPLE 19

Example 18 was repeated but, instead of submerging the circuit 20 boards in electrolyte, the circuit boards were sprayed using the same technique as in Example 4. The spray system used in Example 4 was modified to accommodate the surfaces of the boards. The results were identical to Example 18. It is theorized the flow of electrolyte mechanically cleaned the adjacent nonmetal portions of the circuit boards, but the exact mechanism which cleaned the nonmetallic portions is not known.

EXAMPLE 20

An electrolyte bath was prepared as in Example 1. A variety of gold, silver and copper jewelry was electrolytically treated using the submersion technique described in Example 1. Electrolytic treatment was applied for 1 to 1.5 minutes. The jewelry was removed, air dried and inspected. All tarnish and oxidation was removed and the jewelry was restored to almost new condition.

While we have illustrated and described a preferred embodiment of our invention, it is understood that this is capable of modification, and we therefore do not wish to be limited to the precise details set forth, but desire to avail ourselves of such changes and alterations as fall within the purview of the following claims.

What we claim as our invention is:

1. A method of cleaning a surface of a body, the method comprising the steps of:
   (a) forming a cleaning solution by dissolving disodium phosphate and baking soda in water; and
   (b) applying said cleaning solution to said surface of said body to remove desired materials from said surface.

2. The method of claim 1, wherein said cleaning solution comprises about 0.25 to 1.33 pounds of disodium phosphate per gallon of water, and 0.125 to 0.67 pounds of baking soda per gallon of water.

3. The method of claim 2, wherein said cleaning solution comprises a ratio of about two times as many pounds per gallon of water of disodium phosphate as pounds per gallon of water of baking soda.

4. The method of claim 3, wherein said cleaning solution comprises about 0.5 pounds of disodium phosphate per gallon of water, and about 0.25 pounds of baking soda per gallon of water.

5. The method of claim 1, wherein the pH of said cleaning solution is about 7.0 to about 10.0.

6. The method of claim 5, wherein said pH is about 8.0 to about 8.5.

7. The method of claim 1, wherein said water is distilled water.

8. The method of claim 1, wherein said disodium phosphate is about 98% pure or greater.

9. The method of claim 1, wherein said disodium phosphate is food grade.

10. The method of claim 9, wherein said food grade disodium phosphate is granular.

11. The method of claim 1, wherein said body is conductive, and including the step of:
    (c) flowing current through the cleaning solution and the body.

12. The method of claim 11, wherein said cleaning solution comprises about 0.25 to 1.33 pounds of disodium phosphate per gallon of water, and 0.125 to 0.67 pounds of baking soda per gallon of water.

13. The method of claim 12, wherein said cleaning solution comprises a ratio of about two times as many pounds per gallon of water of disodium phosphate as pounds per gallon of water of baking soda.

14. The method of claim 13, wherein said cleaning solution comprises about 0.5 pounds of disodium phosphate per gallon of water, and about 0.25 pounds of baking soda per gallon of water.

15. The method of claim 11, wherein the pH of said cleaning solution is about 7.0 to about 10.0.

16. The method of claim 15, wherein said pH is about 8.0 to about 8.5.

17. The method of claim 11, wherein said current is supplied from a direct current power source.

18. The method of claims 17, wherein said power source is an inverter power source.

19. The method of claim 17, wherein said power source operates at about 1 amp per gallon of cleaning solution to about 20 amps per gallon of cleaning solution.

20. The method of claim 19, wherein said power source operates at about 2 amps per gallon of cleaning solution to about 10 amps per gallon of cleaning solution.

21. The method of claim 20, wherein said power source operates at about 5 amps per gallon of cleaning solution.

22. The method of claim 17, wherein said cleaning solution is applied by spraying said cleaning solution on said body.

23. A cleaning solution for cleaning a surface of a body, said cleaning solution comprising disodium phosphate and baking soda dissolved in water.

24. The cleaning solution of claim 23, wherein said cleaning solution comprises about 0.25 to 1.33 pounds of disodium phosphate per gallon of water, and 0.125 to 0.67 pounds of baking soda per gallon of water.

25. The cleaning solution of claim 24, wherein said water is distilled water.

26. The cleaning solution of claim 24, wherein said disodium phosphate is about 98% pure or greater.

27. The cleaning solution of claim 24, wherein said disodium phosphate is food grade.

28. The cleaning solution of claim 27, wherein said food grade disodium phosphate is granular.

29. The cleaning solution of claim 24, wherein said cleaning solution comprises a ratio of about two times as many pounds per gallon of water of disodium phosphate as pounds per gallon of water of baking soda.

30. The cleaning solution of claim 29, wherein said cleaning solution comprises about 0.5 pounds of disodium phosphate per gallon of water, and about 0.25 pounds of baking soda per gallon of water.

31. The cleaning solution of claim 23, wherein the pH of said cleaning solution is about 7.0 to about 10.0.

32. The cleaning solution of claim 31, wherein said water is distilled water.

33. The cleaning solution of claim 31, wherein said disodium phosphate is about 98% pure or greater.

34. The cleaning solution of claim 31, wherein said disodium phosphate is food grade.

35. The cleaning solution of claim 34, wherein said food grade disodium phosphate is granular.

36. The cleaning solution of claim 31, wherein said pH is about 8.0 to about 8.5.

37. A method of cleaning a surface of a conductive body, the method comprising the steps of:
(a) applying a cleaning solution to said surface of said conductive body; and
(b) flowing current from a power source through the cleaning solution and the body to remove desired materials from said surface, wherein said power source is an inverter power source.

38. The method of claim 37, wherein said inverter power source operates at about 1 amp per gallon of cleaning solution to about 20 amps per gallon of cleaning solution.

39. The method of claim 38, wherein said inverter power source operates at about 2 amps per gallon of cleaning solution to about 10 amps per gallon of cleaning solution.

40. The method of claim 39, wherein said power source operates at about 5 amps per gallon of cleaning solution.

41. The method of claim 37, wherein the pH of said cleaning solution is about 7.0 to about 10.

42. The method of claim 41, wherein the pH of said cleaning solution is about 8.0 to about 8.5.

43. The method of claim 37, wherein said cleaning solution comprises disodium phosphate and baking soda dissolved in water.

44. An apparatus for cleaning the surface of a conductive body, said apparatus comprising:
(a) a container in which said cleaning is to be performed;
(b) a cleaning solution contained in said container;
(c) a power source having a positive output terminal and a negative output terminal, said negative output terminal being connected to said conductive body;
(d) an anode immersed in said cleaning solution, wherein said anode is connected to the positive output terminal of said power source; and
wherein said conductive body is at least partially immersed in said cleaning solution, and when said power source is activated, current flows through said cleaning solution and to said conductive body to clean said surface.

45. The apparatus of claim 44, wherein said power source is a direct current power source.

46. The apparatus of claim 45, wherein said direct current power source is an inverter power source.

47. The apparatus of claim 44, wherein said cleaning solution comprises disodium phosphate and baking soda dissolved in water.

48. The apparatus of claim 47, wherein said cleaning solution comprises about 0.25 to 1.33 pounds of disodium phosphate per gallon of water, and 0.125 to 0.67 pounds of baking soda per gallon of water.

49. The apparatus of claim 47, wherein the pH of said cleaning solution is about 7.0 to about 10.0.

50. The apparatus of claim 47, where said power source operates at about 1 amp per gallon of cleaning solution to about 20 amps per gallon of cleaning solution.

51. An apparatus for cleaning the surface of a conductive body, said apparatus comprising:
(a) a container in which said cleaning is to be performed, said container being capable of conducting electricity;
(b) a cleaning solution contained in said container;
(c) a power source having a positive output terminal and a negative output terminal, said positive output terminal being connected to said container,
(d) a grid capable of conducting electricity, said grid being disposed within said container in at least partial contact with said conductive body; and
wherein said conductive body is connected to said negative output terminal, wherein said grid is at least partially immersed in said cleaning solution and when said power is activated, current flows through said cleaning solution to said grid, and to said conductive body to clean said surface.

52. The apparatus of claim 51, wherein said power source is a direct current power source.

53. The apparatus of claim 52, wherein said direct current power source is an inverter power source.

54. The apparatus of claim 51, wherein said cleaning solution comprises disodium phosphate and baking soda dissolved in water.

55. The apparatus of claim 54, wherein said cleaning solution comprises about 0.25 to 1.33 pounds of disodium phosphate per gallon of water, and 0.125 to 0.67 pounds of baking soda per gallon of water.

56. The apparatus of claim 54, wherein the pH of said cleaning solution is about 7.0 to about 10.0.

57. The apparatus of claim 54, where said power source operates at about 1 amp per gallon of cleaning solution to about 20 amps per gallon of cleaning solution.

58. An apparatus for cleaning the surface of a conductive body, said apparatus comprising:
(a) a container having a cleaning solution therein;
(b) at least one spray nozzle connected to said container to allow said cleaning solution to flow from said container to said spray nozzles;
(c) a power source having a positive output terminal and a negative output terminal, said positive output terminal being connected to said spray nozzle and said negative output terminal having connected to said conductive body; and
wherein when said power source is activated, said spray nozzle is activated, and said cleaning solution is directed to said conductive body, and current flows through said cleaning solution to said conductive body, to clean said surface.

59. The apparatus of claim 58, wherein said power source is a direct current power source.

60. The apparatus of claim 59, wherein said direct current power source is an inverter power source.

61. The apparatus of claim 58, wherein said cleaning solution comprises disodium phosphate and baking soda dissolved in water.

62. The apparatus of claim 61, wherein said cleaning solution comprises about 0.25 to 1.33 pounds of disodium phosphate per gallon of water, and 0.125 to 0.67 pounds of baking soda per gallon of water.

63. The apparatus of claim 61, wherein the pH of said cleaning solution is about 7.0 to about 10.0.

64. The apparatus of claim 61, where said power source operates at about 1 amp per gallon of cleaning solution to about 20 amps per gallon of cleaning solution.

65. An apparatus for cleaning the surface of a conductive body, said apparatus comprising:
(a) a container in which said cleaning is to be performed;

(b) a cleaning solution contained in said container;
(c) a power source having a positive output terminal and a negative output terminal;
(d) a first grid connected to said positive output terminal;
(e) a second grid connected to said negative output terminal, said second grid having a first and second face;
(f) an insulating material positioned between said first grid and said second grid, wherein said insulating material is in contact with said first grid and said first face of said second grid;
(g) at least one spray nozzle in communication with said cleaning solution so as to allow said cleaning solution to flow from said container to said spray nozzle; and
wherein when said power source is activated, said spray nozzle is activated and said cleaning solution is directed at and washes over said conductive body, current flows through said first metal, said insulating material, said second grid and to said conductive body to clean said surface.

66. The apparatus of claim 65, wherein said power source is a direct current power source.

67. The apparatus of claim 66, wherein said direct current power source is an inverter power source.

68. The apparatus of claim 65, wherein said cleaning solution comprises disodium phosphate and baking soda dissolved in water.

69. The apparatus of claim 68, wherein said cleaning solution comprises about 0.25 to 1.33 pounds of disodium phosphate per gallon of water, and 0.125 to 0.67 pounds of baking soda per gallon of water.

70. The apparatus of claim 68, wherein the pH of said cleaning solution is about 7.0 to about 10.0.

71. The apparatus of claim 68, where said power source operates at about 1 amp per gallon of cleaning solution to about 20 amps per gallon of cleaning solution.

* * * * *